(12) United States Patent
Wu

(10) Patent No.: US 7,467,396 B2
(45) Date of Patent: Dec. 16, 2008

(54) DISC DRIVE AND FLEXIBLE CABLE ASSEMBLY THEREIN

(75) Inventor: Kuan-Heng Wu, Taoyuan (TW)

(73) Assignees: Benq Corporation, Taipei (TW); Qisda Corporation, Taoyuan (TW)

( * ) Notice: Subject to any disclaimer, the term of this patent is extended or adjusted under 35 U.S.C. 154(b) by 379 days.

(21) Appl. No.: 11/169,228

(22) Filed: Jun. 27, 2005

(65) Prior Publication Data

US 2006/0005215 A1    Jan. 5, 2006

(30) Foreign Application Priority Data

Jun. 28, 2004    (TW) .............................. 93118850 A

(51) Int. Cl.
G11B 33/12 (2006.01)
G11B 21/02 (2006.01)
G11B 7/085 (2006.01)

(52) U.S. Cl. ...................................... 720/652; 720/719
(58) Field of Classification Search ......... 720/601–616, 720/652, 659, 663, 672, 675, 676, 680, 689, 720/719

See application file for complete search history.

(56) References Cited

U.S. PATENT DOCUMENTS 6,160,780 A * 12/2000 Furukawa et al. ........... 720/604
2004/0233564 A1 * 11/2004 Kim ............................. 360/39

FOREIGN PATENT DOCUMENTS

| JP | 02044525 A | * | 2/1990 |
| JP | 04082026 A | * | 3/1992 |
| JP | 06236558 A | * | 8/1994 |
| JP | 06243450 A | * | 9/1994 |
| JP | 06243601 A | * | 9/1994 |
| JP | 07111049 A | * | 4/1995 |
| JP | 07262751 A | * | 10/1995 |
| JP | 08138366 A | * | 5/1996 |
| JP | 08153333 A | * | 6/1996 |
| JP | 10199207 A | * | 7/1998 |
| JP | 11144404 A | * | 5/1999 |
| JP | 11149765 A | * | 6/1999 |
| JP | 11195241 A | * | 7/1999 |
| JP | 2000090596 A | * | 3/2000 |
| JP | 2000251421 A | * | 9/2000 |
| JP | 2001319434 A | * | 11/2001 |
| JP | 2002304756 A | * | 10/2002 |
| JP | 2002324389 A | * | 11/2002 |

* cited by examiner

*Primary Examiner*—William J Klimowicz
(74) *Attorney, Agent, or Firm*—Birch, Stewart, Kolasch & Birch, LLP

(57) ABSTRACT

The present invention provides a disc drive and a flexible cable assembly therein. The disc drive includes a circuit board, a flexible cable assembly coupled to the circuit board, and an optical pick-up unit which the flexible cable assembly is electrically connected to. The flexible cable assembly includes a flexible cable and a protector partly attached to the flexible cable. When the optical pick-up unit processes the data on a disc, the protector keeps the flexible cable away from the disc.

13 Claims, 8 Drawing Sheets

DISC DRIVE AND FLEXIBLE CABLE ASSEMBLY THEREIN

BACKGROUND OF THE INVENTION

1. Field of the Invention

The present invention relates to a disc drive, and more in particular, to a disc drive that keeps a flexible cable away from a disc installed in the disc drive during the processing of data on the disc by an optical pick-up unit of the disc drive.

2. Description of the Prior Art

In a conventional disc drive, a flexible cable transmits signals between the movable optical pick-up unit and a circuit board. One end of the flexible cable is electrically connected to the optical pick-up unit, and the other end is electrically connected to a connector of the circuit board. What flexible cables used usually are Flexible Print Circuits, Flexible Flat Circuits, and so on.

FIG. 1 is a schematic diagram showing that the flexible cable 14 connecting the optical pick-up unit 10 with the circuit board 12 is in an ideal state. As shown in FIG. 1, the flexible cable 14 connecting the optical pick-up unit 10 with the connector 13 of circuit board 12 is bent into U-shaped.

FIG. 2 is a schematic diagram showing the raised flexible cable 14 in conventional disc drives. As shown FIG. 2, a scar, often appears in position 'a', is made when the flexible cable 14 is inserted into connector 13, or due to the movement of the optical pick-up unit 10. The scar makes the flexible cable 14 raise and even rub against the disc 16. When the optical pick-up unit 10 processes the data on the disc 16, the raised flexible cable 14 scrapes the spinning disk 16 and even damages the disc 16.

Accordingly, the main objective of the present invention is to provide a disc drive to overcome the above problems, so as to avoid the flexible cable 14 rubbing against the disc 16.

SUMMARY OF THE INVENTION

The main objective of the present invention is to provide a disc drive that keeps a flexible cable therein away from a disc installed in the disc drive when an optical pick-up unit of the disc drive processes the data on the disc.

Another objective of the present invention is to provide a flexible cable assembly which is applied in a disc drive. The flexible cable assembly employs a protector to shift a crooked part of a flexible cable of the flexible cable assembly out of the range that a disc installed in the disc drive projects so the protector prevents the flexible cable from contacting the disc. The protector partly attaches to the flexible cable.

The present invention provides a disc drive including a circuit board, a flexible cable, an optical pick-up unit, and a protector. The flexible cable is via one end thereof electrically connected to the circuit board, and via the other end thereof electrically connected to the optical pick-up unit. The optical pick-up unit functions to process data on a disc installed in the disc drive. The protector partly attaches to the flexible cable. During the processing of data on the disc by the optical pick-up unit, the protector keeps the flexible cable away from the disc.

The present invention provides a flexible cable assembly which transmits a plurality of signals between a first apparatus and a second apparatus. The flexible cable assembly includes a conductor, an insulator and a protector. The insulator substantially covers the conductor. The protector is partly fixed on the insulator.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
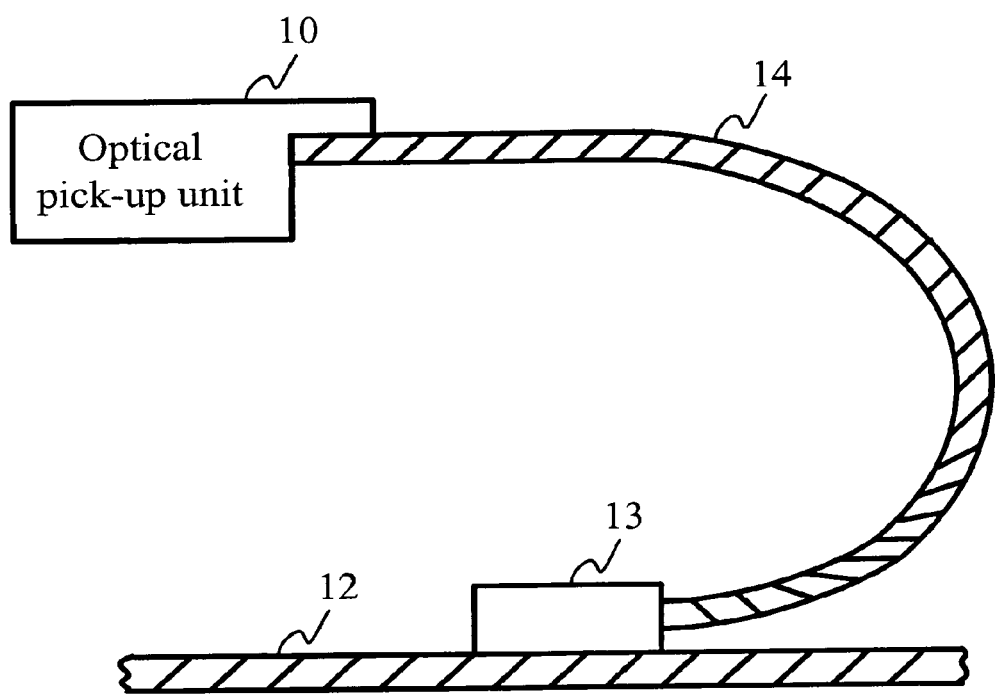
FIG. 1 is a schematic diagram showing an ideal state of a flexible cable connecting an optical pick-up unit with a circuit board in a disc drive.
Figure 2:
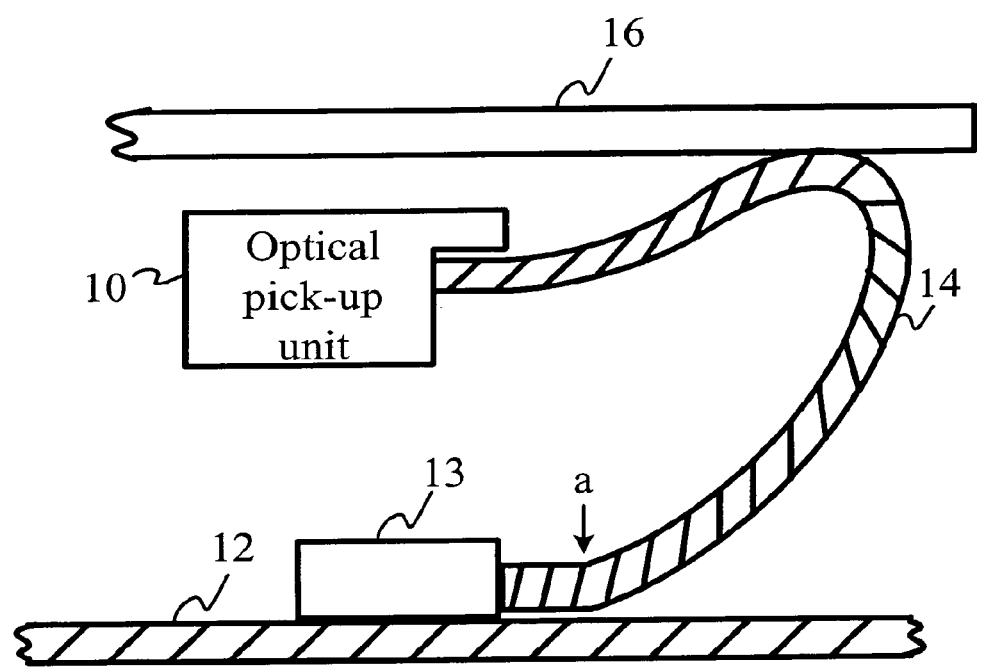
FIG. 2 is a schematic diagram showing that the flexible cable thereof exhibits a scar and becomes raised.
Figure 3:
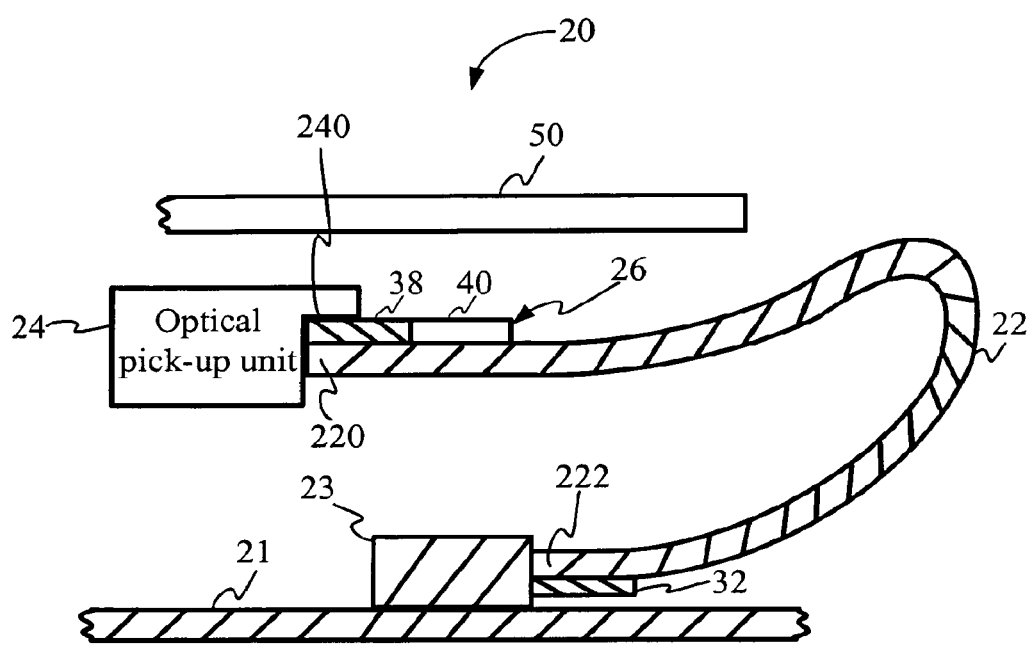
FIG. 3 is a schematic diagram showing a disc drive according to a preferred embodiment of the present invention.

Referring to FIG. 3, FIG. 3 is a schematic diagram showing a disc drive 20 according to a preferred embodiment of the present invention. The disc drive 20 comprises a circuit board 21, a flexible assembly including a flexible cable 22 and a protector 26, and an optical pick-up unit 24. The flexible cable 22 is via one end thereof electrically connected to the circuit board 21, and via the other end thereof electrically connected to the optical pick-up unit 24. As shown in FIG. 3, the flexible cable 22 has a first end 220 and a second end 222. The first end 220 is coupled to the optical pick-up unit 24. The second end 222 is opposite to the first end 220 and coupled to a connector 23 disposed on the circuit board 21. The protector 26 is partly attached to the flexible cable 22 and is substantially aligned with the first end 220 of the flexible cable 22. The optical pick-up unit 24 functions to process data on a disc 50 installed in the disc drive 20.

Figure 4A:
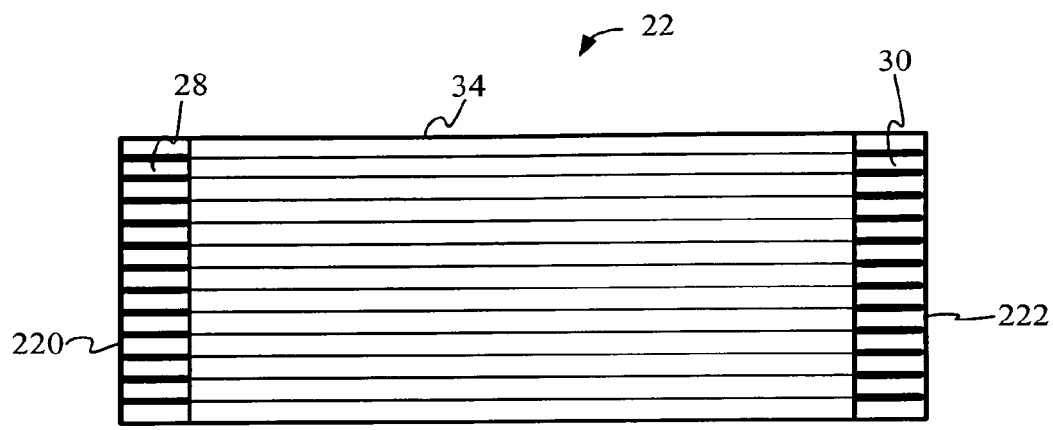
FIG. 4A is a schematic diagram showing a first surface of the flexible cable in FIG. 3.
Figure 4B:
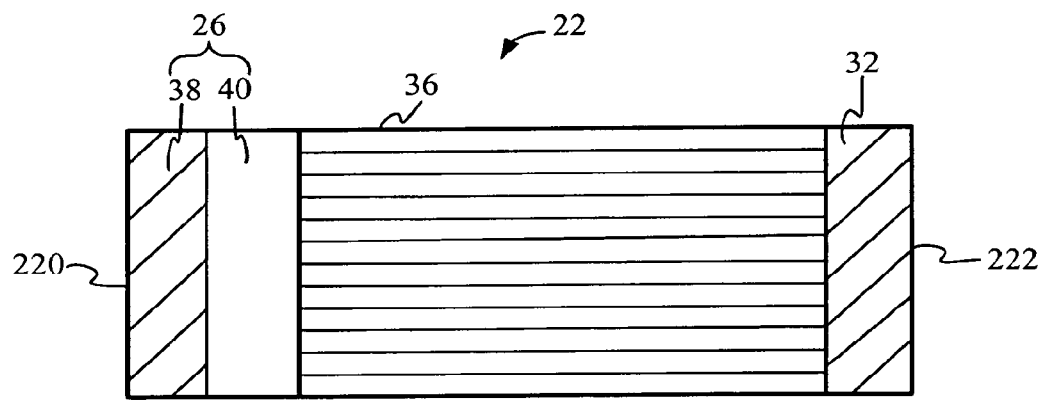
FIG. 4B is a schematic diagram showing a second surface of the flexible cable in FIG. 3.

During the processing of data on the disc 50 by the optical pick-up unit 24, the protector 26 keeps the flexible cable 22 away from the disc 50, and the protector 26 shifts a crooked part of the flexible cable 22 out of the range that the disc 50 projects. In other words, the protector 26 prevents the flexible cable 22 from contacting the disc 50. Referring to FIG. 4A and FIG. 4B, FIG. 4A is a schematic diagram showing a first surface 34 of the flexible cable 22 in FIG. 3, and FIG. 4B is a schematic diagram showing a second surface 36 of the flexible cable 22 in FIG. 3. The flexible cable 22 further includes a first conductive terminal 28, a second conductive terminal 30, and a fixing board 32. As shown in FIG. 4A, the first conductive terminal 28 and the second conductive terminal 30 are respectively disposed on the first surface 34 of the flexible cable 22. The flexible cable 22 is electrically connected to the optical pick-up unit 24 via the first conductive terminal 28, and electrically connected to the connector 23 of the circuit board 21 via the second conductive terminal 30. As shown in FIG. 4B, the fixing board 32, disposed on the second surface 36 and opposite to the second conductive terminal 30, is for assisting the attachment of the second conductive terminal 30 to the connector 23 of the circuit board 21. The protector 26 is substantially aligned with the first end 220 of the flexible cable 22, and the fixing board 32 is substantially aligned with the second end 222 of the flexible cable 22. Referring to FIG. 3 and FIG. 4B, part of the fixing board 32 and the second conductive terminal 30 are in the connector 23 when the flexible cable 22 is electrically connected to the circuit board 21. and part of the fixing board 32 and the second conductive terminal 30 are out of the connector 23 when the flexible cable 22 is detached from the circuit board 21. In one embodiment, the first surface 34 is opposite to the second surface 36, and the fixing board 32 is disposed at the position on the second surface 36 opposite to that of the second conductive terminal 30 disposed on the first surface 34.

Figure 5:
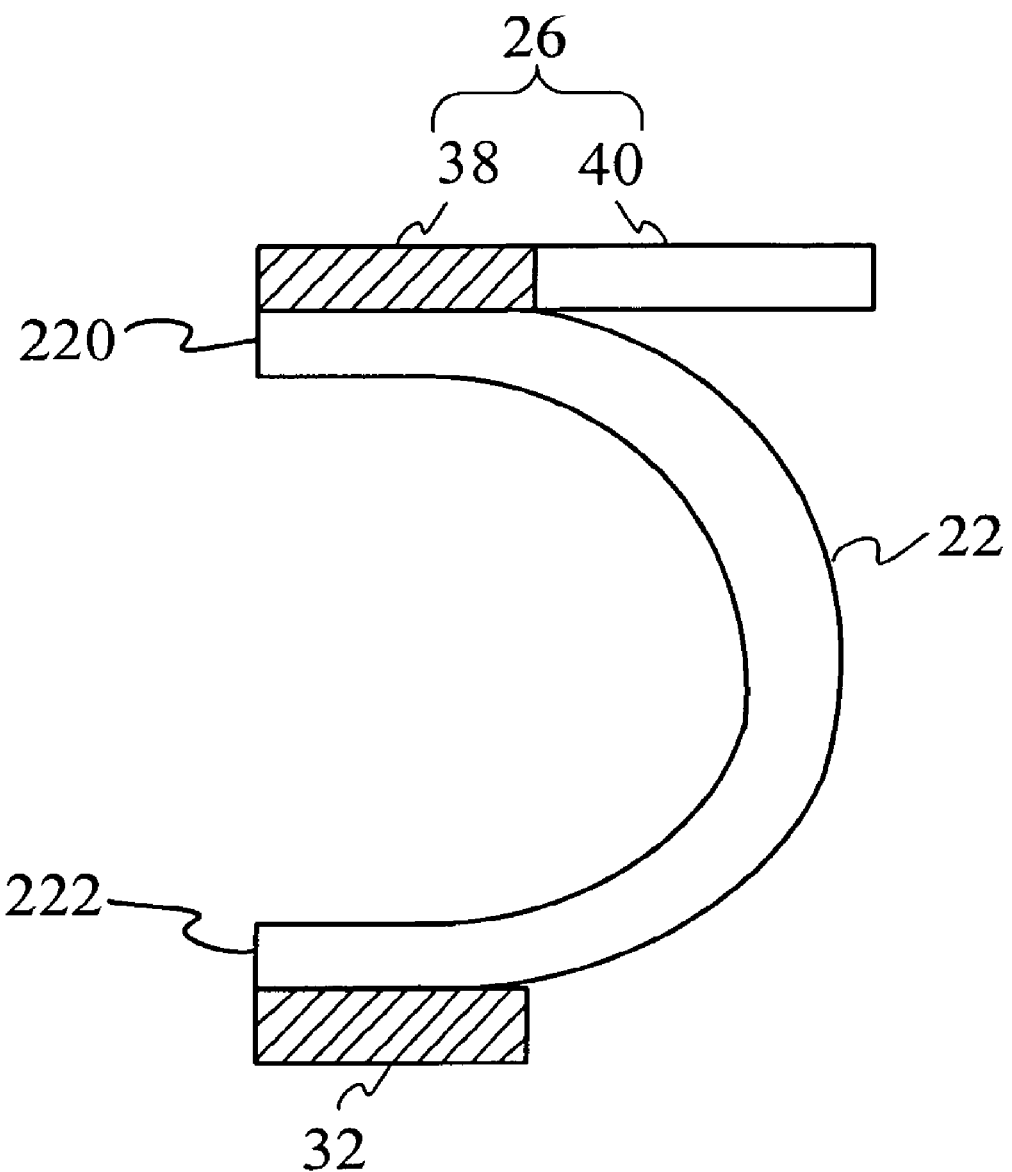
FIG. 5 is a detailed diagram illustrating the flexible cable assembly in FIG. 3.

Referring to FIG. 5, a detailed diagram of the flexible cable assembly in FIG. 3 is illustrated. The protector 26 is disposed on the second surface 36 of the flexible cable 22 opposite to the first conductive terminal 28. The protector 26 is partly fixed on the flexible cable 22 so as not to affect the deformation of the flexible cable 22. The fixing board 32, disposed on the second surface 36 and opposite to the second conductive terminal 30, is for assisting the attachment of the second conductive terminal 30 to the connector 23 of the circuit board 21. As shown in FIG. 5, the protector 26 ,includes a joint part 38 and an extended part 40. The joint part 38 is fixed on the flexible cable 22. The extended part 40 is joined together with the joint part 38 but separated from the flexible cable 22. Referring to FIG. 3. when the first conductive terminal 28 is electrically connected to the optical pick-up unit 24, the joint part 38 of the protector 26 abuts against a side wall 240 of the optical pick-up unit 24 and the extended part 40 of the protector 26 extends parallel to the side wall 240. In one embodiment, the protector 26 is made of a plastic material.

Figure 6A:
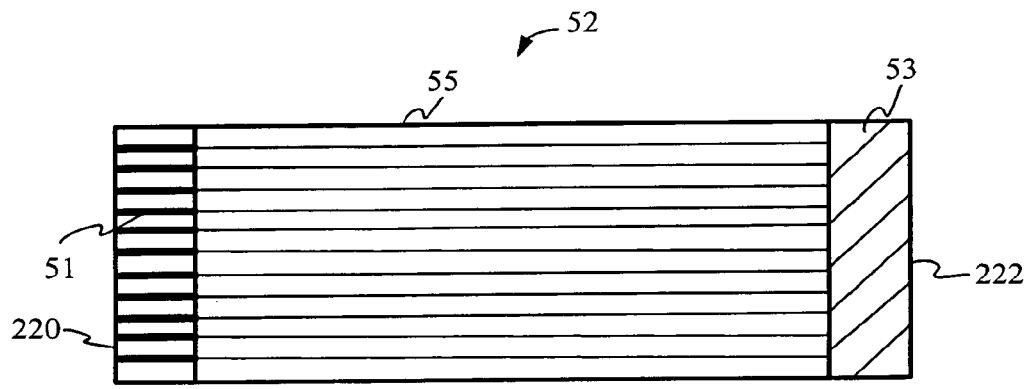
FIG. 6A is a schematic diagram showing a first surface of a flexible cable according to another preferred embodiment of the present invention.
Figure 6B:
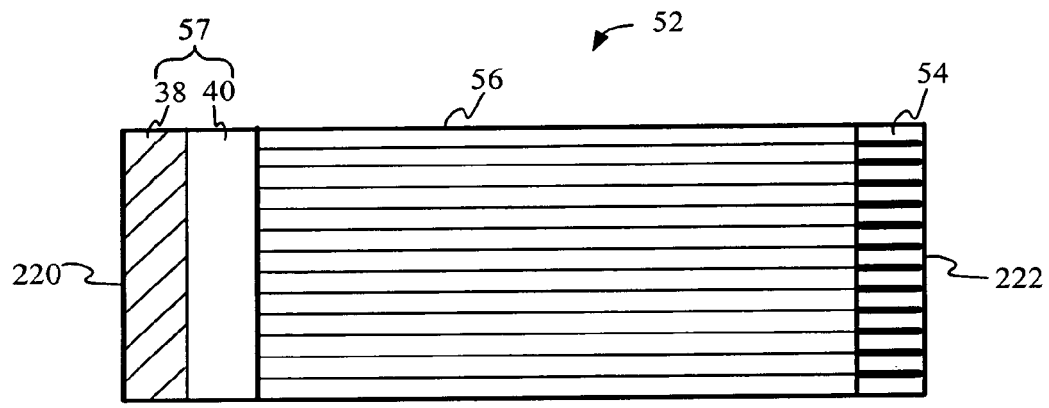
FIG. 6B is a schematic diagram showing a second surface of the flexible cable in FIG. 6A.

Referring to FIG. 6A and FIG. 6B, FIG. 6A is a schematic diagram showing a first surface 55 of the flexible cable 52 according to another preferred embodiment of the present invention. FIG. 6B is a schematic diagram showing a second surface 56 of the flexible cable 52. Differing from the flexible cable 22 shown in FIGS. 4A and 4B, a first conductive terminal 51 and a second conductive terminal 54 are disposed on the first surface 55 and the second 56, respectively. It is noted that the first conductive terminal 51 performs the same function as the first conductive terminal 28 shown in FIG. 4A and the second conductive terminal 54 performs the same function as the second conductive terminal 30 shown in FIG. 4A.

Figure 7:
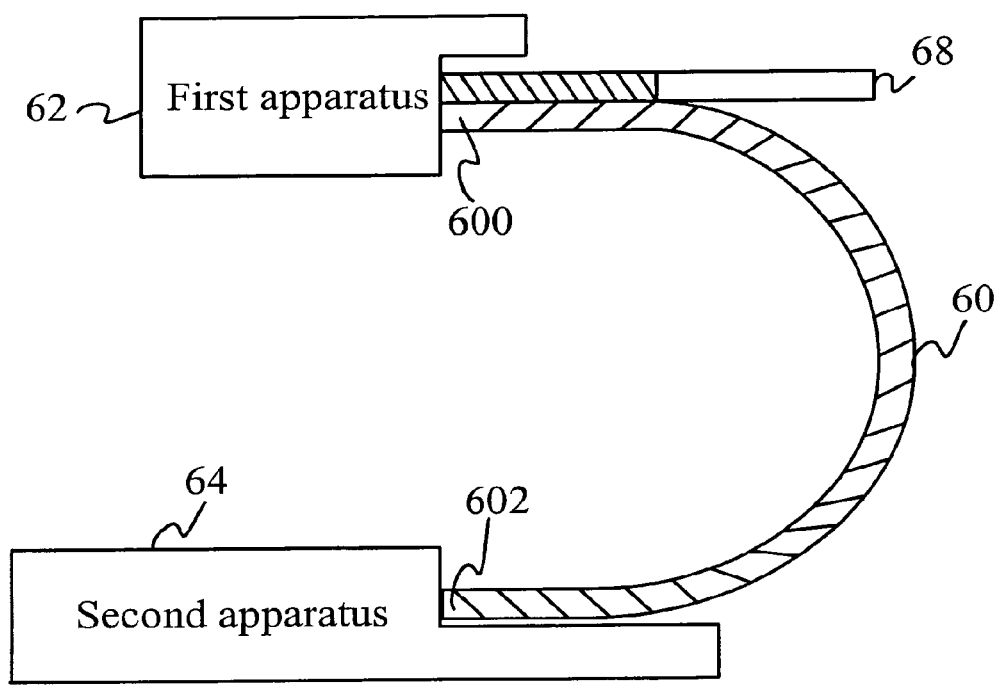
FIG. 7 is a schematic diagram showing how the flexible cable assembly of the present invention is used.
Figure 7A:
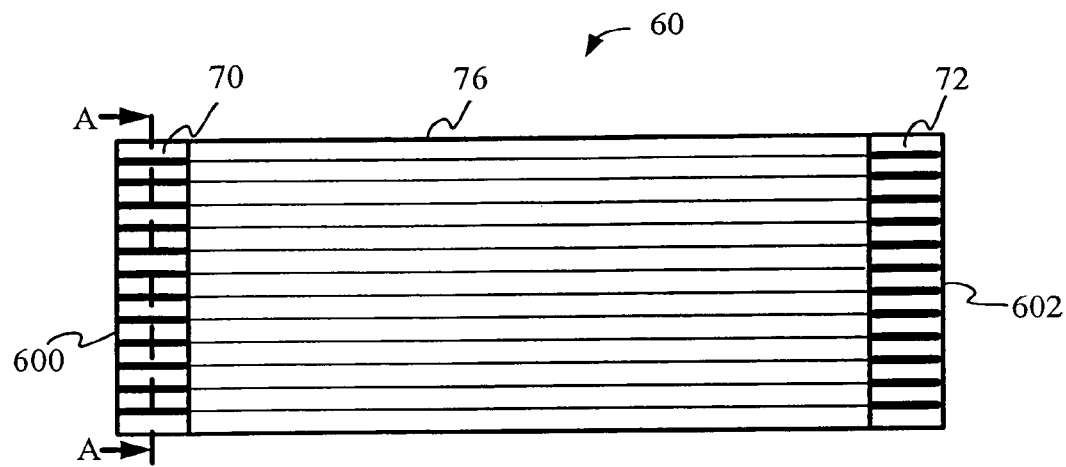
FIG. 7A is a schematic diagram showing the first surface of the flexible cable in FIG. 7.
Figure 7B:
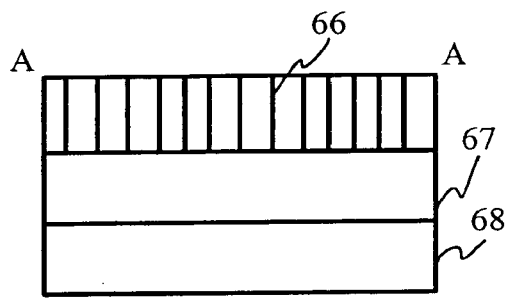
FIG. 7B is a profile showing the flexible cable assembly in FIG. 7.
Figure 7C:
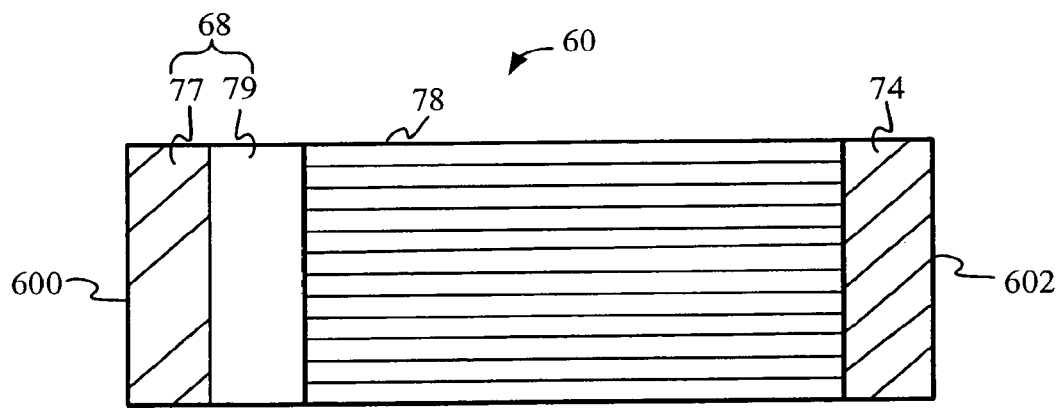
FIG. 7C is a schematic diagram showing the second surface of the flexible cable in FIG. 7.

Referring to FIGS. 7, 7A, 7B and 7C, a flexible cable assembly according to the present invention connecting a first apparatus 62 with a second apparatus is illustrated. FIG. 7 is a schematic diagram showing how the flexible assembly connects the first apparatus 62 with the second apparatus 64. FIG. 7A is a schematic diagram showing a first surface 76 of the flexible cable 60 in FIG. 7. FIG. 7B is a cross-sectional view of the flexible cable 60 along the A-A line in FIG. 7. FIG. 7C is a schematic diagram showing a second surface 78 of the flexible cable 60 in FIG. 7. The flexible assembly functions to transmit a plurality of signals between the first apparatus 62 and the second apparatus 64. The flexible cable assembly includes a flexible cable 60, a conductor 66, an insulator 67 and a protector 68. The flexible cable 60 has a first end 600 and a second end 602. The first end 600 is coupled to the first apparatus 62. The second end 602 is opposite to the first end 600 and coupled to the second apparatus 64. As shown in FIG. 7C, the protector 68 is substantially aligned with the first end 600 of the flexible cable 60. The flexible cable assembly further includes a fixing board 74 which is substantially aligned with the second end 602 of the flexible cable 60.

The insulator 67 substantially covers the conductor 66. The remainder of the conductor, not covered, forms a first conductive terminal 70 and a second conductive terminal 72. In one embodiment, the conductor 66 is a copper foil, and the insulator 67 is a plastic component. The first apparatus 62 is an optical pick-up unit of a disc drive, and the second apparatus 64 is a circuit board of the disc drive. The description of this embodiment refers to the recitation with regard to FIGS. 3 through 6.

The flexible cable assembly according to the invention is applied in a disc drive to connect an optical pick-up unit of the disc drive with a circuit board of the disc drive. From the above recitation, it is evident that the protector substantially covers the flexible cable to shift a crooked part of the flexible cable out of the range that the disc projects, so that the protector prevents the flexible cable from rubbing against the spinning disc. Therefore, the disc drive and the flexible cable assembly of the present invention efficiently prevent the flexible cable from contacting the disc.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A disc drive for processing a data on a disc, said disc drive comprising:

a circuit board;

a flexible cable assembly coupled to the circuit board, including:

a flexible cable having a first end and a second end opposite to the first end and coupled to the circuit; and a protector partly attached to the flexible cable; and substantially aligned with the first end of the flexible cable; and an optical pick-up unit connected to the flexible cable wherein the protector keeps the flexible cable away from the disc when the optical pick-up unit processes the data on the disc, wherein the protector includes a joint part fixed to the flexible cable, and an extended part joined together with the joint part and separated from the flexible cable, wherein the flexible cable further includes a first conductive terminal exposed on a first surface of the flexible cable electrically connecting to the optical pick-up unit, and the protector is disposed on a second surface of the flexible cable and opposite to the first conductive terminal, and wherein said disc drive further comprises:

a connector disposed on the circuit board;

a second conductive terminal exposed on the first surface of the flexible cable and electrically connecting to the connector on the circuit board; and a fixing board, disposed on the second surface of the flexible cable, opposite to the second conductive terminal and substantially aligned with the second end of the flexible cable;

wherein part of the fixing board and the second conductive terminal are in the connector when the flexible cable is electrically connected to the circuit board, and part of the fixing board and the second conductive terminal are out of the connector when the flexible cable is detached from the circuit board.

2. The disc drive of claim 1, wherein the flexible cable includes a conductor and an insulator substantially covering the conductor.

3. The disc drive of claim 2, wherein the insulator is made of a plastic material.

4. The disc drive of claim 1, wherein when the first conductive terminal is electrically connected to the optical pick-up unit, the joint part of the protector abuts against a side wall of the optical pick-up unit and the extended part of the protector extends parallel to the side wall.

5. The disc drive of claim 1, wherein the protector is made of a plastic material.

6. A disc drive for processing a data on a disc, said disc drive comprising:
   a circuit board;
   a flexible cable assembly coupled to the circuit board, including:
      a flexible cable having a first end and a second end opposite to the first end and coupled to the circuit board; and
      a protector partly attached to the flexible cable and substantially aligned with the first end of the flexible cable; and
   an optical pick-up unit connected to the first end of the flexible cable;
   wherein the protector keeps the flexible cable away from the disc when the optical pick-up unit processes the data on the disc,
   wherein the protector includes a joint part fixed to the flexible cable, and an extended part joined together with the joint part and separated from the flexible cable,
   wherein the flexible cable further includes a first conductive terminal exposed on a first surface of the flexible cable electrically connecting to the optical pick-up unit, and the protector is disposed on a second surface of the flexible cable and opposite to the first conductive terminal, and
   wherein said disc drive further comprises:
   a connector disposed on the circuit board;
   a second conductive terminal exposed on the second surface of the flexible cable and electrically connecting to the connector on the circuit board; and
   a fixing board, disposed on the first surface of the flexible cable, opposite to the second conductive terminal and substantially aligned with the second end of the flexible cable;
   wherein part of the fixing board and the second conductive terminal are in the connector when the flexible cable is electrically connected to the circuit board, part of the fixing board and the second conductive terminal are out of the connector when the flexible cable is detached from the circuit board.

7. A flexible cable assembly for transmitting a plurality of signals between a first apparatus and a second apparatus, said flexible cable assembly comprising:
   a flexible cable having a first end coupled to the first apparatus, and a second end, opposite to the first end and coupled to the second apparatus; and
   a protector partly attached on the flexible cable and substantially aligned with the first end of the flexible cable,
   wherein the protector includes a joint part fixed to the flexible cable, and an extended part joined together with the joint part and separated from the flexible cable,
   wherein the flexible cable further includes a first conductive terminal exposed on a first surface of the flexible cable electrically connecting to the first apparatus, and the protector is disposed on a second surface of the flexible cable and opposite to the first conductive terminal, and
   wherein said flexible cable assembly further comprises:
   a second conductive terminal exposed on the first surface of the flexible cable and for electrically connected to the second apparatus; and
   a fixing board, disposed on the second surface of the flexible cable, the fixing board being opposite to the second conductive terminal and substantially aligned with the second end of the flexible cable.

8. The flexible cable assembly of claim 7, wherein the flexible cable includes a conductor and an insulator substantially covering the conductor.

9. The flexible cable assembly of claim 8, wherein the conductor is a copper foil.

10. The flexible cable assembly of claim 8, wherein the insulator is made of a plastic material.

11. The flexible cable assembly of claim 7, wherein the protector is made of a plastic material.

12. The flexible cable assembly of claim 7, wherein the first apparatus is an optical pick-up unit of a disc drive and the second apparatus is a circuit board of the disc drive.

13. A flexible cable assembly for transmitting a plurality of signals between a first apparatus and a second apparatus, said flexible cable assembly comprising:
   a flexible cable having a first end coupled to the first apparatus, and a second end, opposite to the first end and coupled to the second apparatus; and
   a protector partly attached on the flexible cable and substantially aligned with the first end of the flexible cable,
   wherein the protector includes a joint part fixed to the flexible cable, and an extended part joined together with the joint part and separated from the flexible cable,
   wherein the flexible cable further includes a first conductive terminal exposed on a first surface of the flexible cable electrically connecting to the first apparatus, and the protector is disposed on a second surface of the flexible cable and opposite to the first conductive terminal, and
   wherein said flexible cable assembly further comprises:
   a second conductive terminal exposed on the second surface of the flexible cable and for electrically connecting to the second apparatus; and
   a fixing board, disposed on the first surface of the flexible cable, the fixing board being opposite to the second conductive terminal and substantially aligned with the second end of the flexible cable.

* * * * *